(12) United States Patent
Coffy et al.

(10) Patent No.: US 9,076,749 B2
(45) Date of Patent: Jul. 7, 2015

(54) ELECTRONIC SYSTEM COMPRISING STACKED ELECTRONIC DEVICES COMPRISING INTEGRATED-CIRCUIT CHIPS

(71) Applicant: STMicroelectronics (Grenoble 2) SAS, Grenoble (FR)

(72) Inventors: Romain Coffy, Voiron (FR); Rémi Brechignac, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 14/512,060

(22) Filed: Oct. 10, 2014

(65) Prior Publication Data

US 2015/0102500 A1 Apr. 16, 2015

(30) Foreign Application Priority Data

Oct. 15, 2013 (FR) .................................... 13 60006

(51) Int. Cl.
| | |
|---|---|
| H01L 23/02 | (2006.01) |
| H01L 23/00 | (2006.01) |
| H01L 23/498 | (2006.01) |
| H01L 25/065 | (2006.01) |
| H01L 25/10 | (2006.01) |
| H05K 1/14 | (2006.01) |
| H01L 23/522 | (2006.01) |
| H01L 25/18 | (2006.01) |

(52) U.S. Cl.
CPC ......... H01L 24/33 (2013.01); *H01L 2225/0652* (2013.01); H01L 23/49833 (2013.01); H01L 25/0657 (2013.01); H01L 25/105 (2013.01); *H01L 25/18* (2013.01); *H05K 1/144* (2013.01); *H01L 2225/06517* (2013.01); *H01L 2225/06575* (2013.01); *H01L 2225/06589* (2013.01); *H01L 2225/1023* (2013.01); *H01L 2225/1058* (2013.01); *H01L 2225/1094* (2013.01); H01L 23/5226 (2013.01); *H01L 2224/32146* (2013.01); *H01L 2224/32235* (2013.01)

(58) Field of Classification Search
USPC .................. 257/686, 777, E25.006, E25.021, 257/E25.027, E23.085, E25.013, E23.021
See application file for complete search history.

(56) References Cited

U.S. PATENT DOCUMENTS

| | | | | |
|---|---|---|---|---|
| 7,619,305 | B2 * | 11/2009 | Fan et al. | 257/686 |
| 8,530,277 | B2 * | 9/2013 | Ko et al. | 438/109 |
| 8,749,040 | B2 * | 6/2014 | Chi et al. | 257/686 |
| 2009/0309197 | A1 * | 12/2009 | Chow et al. | 257/659 |
| 2010/0133675 | A1 * | 6/2010 | Yu et al. | 257/686 |
| 2013/0270685 | A1 * | 10/2013 | Yim et al. | 257/686 |

* cited by examiner

*Primary Examiner* — Jasmine Clark
(74) *Attorney, Agent, or Firm* — Gardere Wynne Sewell LLP

(57) ABSTRACT

An electronic system includes a first integrated-circuit chip and a second integrated-circuit chip. A first substrate wafer is positioned between the first and second integrated-circuit chips and configured with a first connection network to make electrical connection to the first integrated-circuit chip. A second substrate wafer, configured with a second connection network to make electrical connection to the second integrated-circuit chip, is positioned facing the first substrate wafer. The connection networks of the first and second substrate wafers are electrically connected through connection structures. A third substrate wafer, including a third connection network, is thermally in contact with the first integrated-circuit chip and electrically connected to the first connection network of the first substrate wafer through further connection structures. The further connection structure may be formed using another substrate wafer.

16 Claims, 2 Drawing Sheets

ELECTRONIC SYSTEM COMPRISING STACKED ELECTRONIC DEVICES COMPRISING INTEGRATED-CIRCUIT CHIPS

PRIORITY CLAIM

This application claims priority from French Application for Patent No. 1360006 filed Oct. 15, 2013, the disclosure of which is incorporated by reference.

TECHNICAL FIELD

The present invention relates to the field of microelectronics.

BACKGROUND

It is known to construct electronic systems which comprise electronic devices stacked on one another and electrically connected to one another, each including at least one integrated-circuit chip.

The stacking of electronic devices has, in particular, the advantages of improving the performance of the electrical connections and reducing the size. In some cases, it nevertheless arises that some of the integrated-circuit chips produce heat, and the heat produced heats other integrated-circuit chips and then degrades the performance of the latter. This is the case, in particular, when a first electronic device comprises a processor chip which produces heat and a second electronic device, stacked on the first, comprises a memory chip, the function of which in particular is degraded when its temperature rises.

The circumstances described above constitute an obstacle to increasing the performance of the electronic system, in particular the program execution speeds. The situation which currently consists in adopting a compromise between the desired performance of the electronic systems and their size is not, however, satisfactory, particularly in the field of portable equipment such as mobile phones.

SUMMARY

One embodiment provides an electronic system which comprises at least one first integrated-circuit chip and at least one second integrated-circuit chip, between which at least one substrate wafer extends, and another substrate wafer placed on the same side as one of the chips in relation to the substrate wafer.

The proposed electronic system may comprise: a first electronic device comprising a first substrate wafer provided with a first electrical connection network and carrying, below one face, at least one first integrated-circuit chip connected to this first electrical connection network; a second electronic device comprising a second substrate wafer provided with a second electrical connection network and carrying at least one second integrated-circuit chip connected to this second electrical connection network; and a third electronic device comprising a third substrate wafer provided with a third electrical connection network.

The first electronic device and the second electronic device may be placed above one another in a position such that the first substrate wafer and the second substrate wafer extend between the first chip and the second chip.

The third substrate wafer may be placed above the first electronic device on the same side as the first chip.

Electrical connection elements may be interposed between the first electronic device and the second electronic device and connect the first electrical connection network and the second electrical connection network.

Electrical connection elements may be interposed between the first electronic device and the third substrate and may connect the first electrical connection network and the third electrical connection network.

The third electrical connection network may comprise external electrical connection pads arranged on the face of the third substrate wafer.

A layer of a thermally conductive material may be interposed between the first chip and the third substrate wafer.

Electrical connection elements, interposed between the first electronic device and the third substrate, may comprise a substrate wafer provided with an electrical connection network connecting the first electrical connection network and the third electrical connection network.

The substrate wafer of the third electronic device may comprise metal vias located in the region of the chip of the first electronic device.

BRIEF DESCRIPTION OF THE DRAWINGS

An electronic system according to a particular embodiment of the present invention will now be described by way of nonlimiting example, and illustrated by the drawing in which.

DETAILED DESCRIPTION OF THE DRAWINGS

Figure 1:
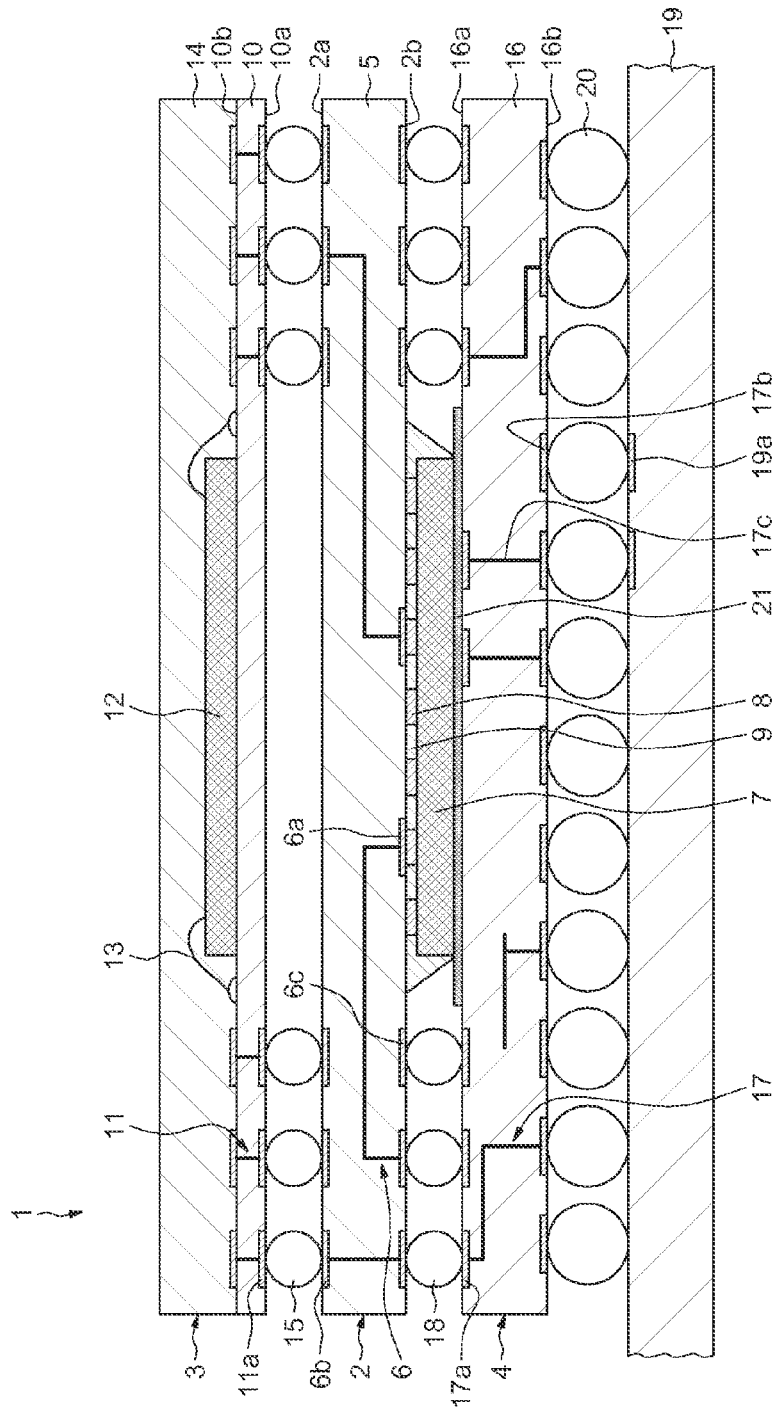
FIG. 1 represents a cross section of an electronic system.

As illustrated in FIG. 1, an electronic system 1 comprises, stacked, a first electronic device 2, a second electronic device 3 placed above one face 2a of the electronic device 2, and a complementary third electronic device 4 placed above an opposite face 2b of the electronic device 2.

The first electronic device 2 comprises a first substrate wafer 5 made of an insulating material, which is provided with a first metal network 6 for electrical connection of one face to the other, optionally comprising one or more integrated metallization levels connected by metal vias.

The first electronic device 2 comprises at least one integrated-circuit chip 7 mounted above, for example, a central part of the face 2b of the substrate wafer 5 by means of electrical connection elements 8 which electrically connect the chip 7 to pads 6a of the first electrical connection network 6. Interposed between the face 2b of the substrate wafer 5 and the chip 7, there is an insulating material 9 for encapsulation of the electrical connection elements 8.

The second electronic device 3 comprises a second substrate wafer 10 made of an insulating material, which has one face 10a adjacent to the face 2a of the substrate wafer 5 and an opposite face 10b, and which is provided with a second metal network 11 for electrical connection of one face to the other, optionally comprising one or more integrated metal layers for electrical connection.

The second electronic device 3 comprises at least one integrated-circuit chip 12 which is fixed on a central part of the face 10b of the substrate wafer 10, for example by adhesive bonding, and which is connected to the second metal electrical connection network 11 by means of electrical connection wires 13. The chip 12 and the electrical connection wires 13 are embedded in an encapsulation material 14 provided on the face 10b of the substrate wafer 10.

The second electronic device 3 is mounted on the first electronic device 2 by means of metal electrical connection elements 15, such as beads, which electrically connect pads 6b of the first electrical connection network 6 and pads 11a of the second electrical connection network 11.

The third electronic device 4 comprises a third substrate wafer 16 made of an insulating material, which has one face 16a adjacent to the face 2b of the substrate wafer 5, so that the chip 7 extends next to the substrate wafer 16 of the electronic device 4, and an opposite face 16b, and which is provided with a third metal network 17 for electrical connection of one face to the other, optionally comprising one or more integrated metallization levels connected by metal vias.

The third electronic device 4 is mounted on the first electronic device 2 by means of metal electrical connection elements 18, such as beads, which are placed around the chip 12 and which electrically connect pads 6c of the first electrical connection network 6 and pads 17a of the third electrical connection network 17.

The electronic system 1 may be mounted on a printed circuit board 19, in a position such that the face 16b of the substrate wafer 16 is adjacent to this printed circuit board 19, by means of metal electrical connection elements 20, such as beads, which electrically connect external electrical connection pads 17b of the third electrical connection network 17 and pads 19a of the printed circuit board 19.

According to one alternative embodiment, the chip 7, which is placed between the substrate wafer 5 of the electronic device 2 and the substrate wafer 16 of the electronic device 4, may be in contact with the face 16a of this substrate wafer 16.

According to one alternative embodiment, the chip 7 may be at a short distance from the face 16a of the substrate wafer 16, and a layer 21 of a thermally conductive material, such as a thermal adhesive, may be interposed between the chip 7 and the face 16a of the substrate wafer 16.

It follows from the description above that the substrate wafers 5 and 10 extend between the chips 7 and 12, that the chips 7 and 12 are thus distanced from one another and separated by the substrate wafer 5, the substrate wafer 10 and the space separating these substrate wafers 5 and 10, and that the substrate wafer 16 constitutes an intermediate means for mounting of the stacked first and second electronic devices 2 and 3 and an intermediate means for electrical connection to the printed circuit board 19.

The chip 7 may be a processor chip giving off heat, and the chip 12 may be a memory chip.

The device described above by way of example has the following advantages.

The heat produced by the chip 7 preferentially diffuses, on the side facing away from the position of the chip 12, into the substrate wafer 16, optionally via the thermally conductive layer 21, and into the metal electrical connection network 17, then diffuses into the printed circuit board 19 via the electrical connection elements 20. Advantageously, the substrate wafer 16 of the electronic device 4 may be provided with specific, direct or indirect, metal vias 17c from one face to the other, which are located in the region of the chip 7, and optionally in the region of a hot region of the chip 7, so as to facilitate transfer of the heat from the chip 7 to the printed circuit board 19. These metal vias 17c may optionally form part of the electrical connection network 17.

The heat produced by the chip 7 also diffuses into the space separating the electronic device 2 and the electronic device 3, into the space separating the electronic device 2 and the electronic device 4, and into the space separating the electronic device 4 and the printed circuit board 19, before being discharged to the exterior.

Thus, the chip 7 is cooled, and the diffusion of the heat produced by the chip 7 of the electronic device 2 in the direction of the chip 12 of the electronic device 3 is limited, so that the chip 12 is protected against any excessive elevation of its temperature.

It follows from the description above that the third electronic device 4 provided with the metal network 17, including the vias 17c, together with the electronic devices 2 and 3 provided with the chips 7 and 12, constitutes an intermediate means for preferential collection and for transfer of the heat produced by the chip 7 of the electronic device 2 which lies next to it, to the printed circuit board 19, and an intermediate means for electrical connection of the electronic devices 2 and 3 to this printed circuit board 19.

Figure 2:
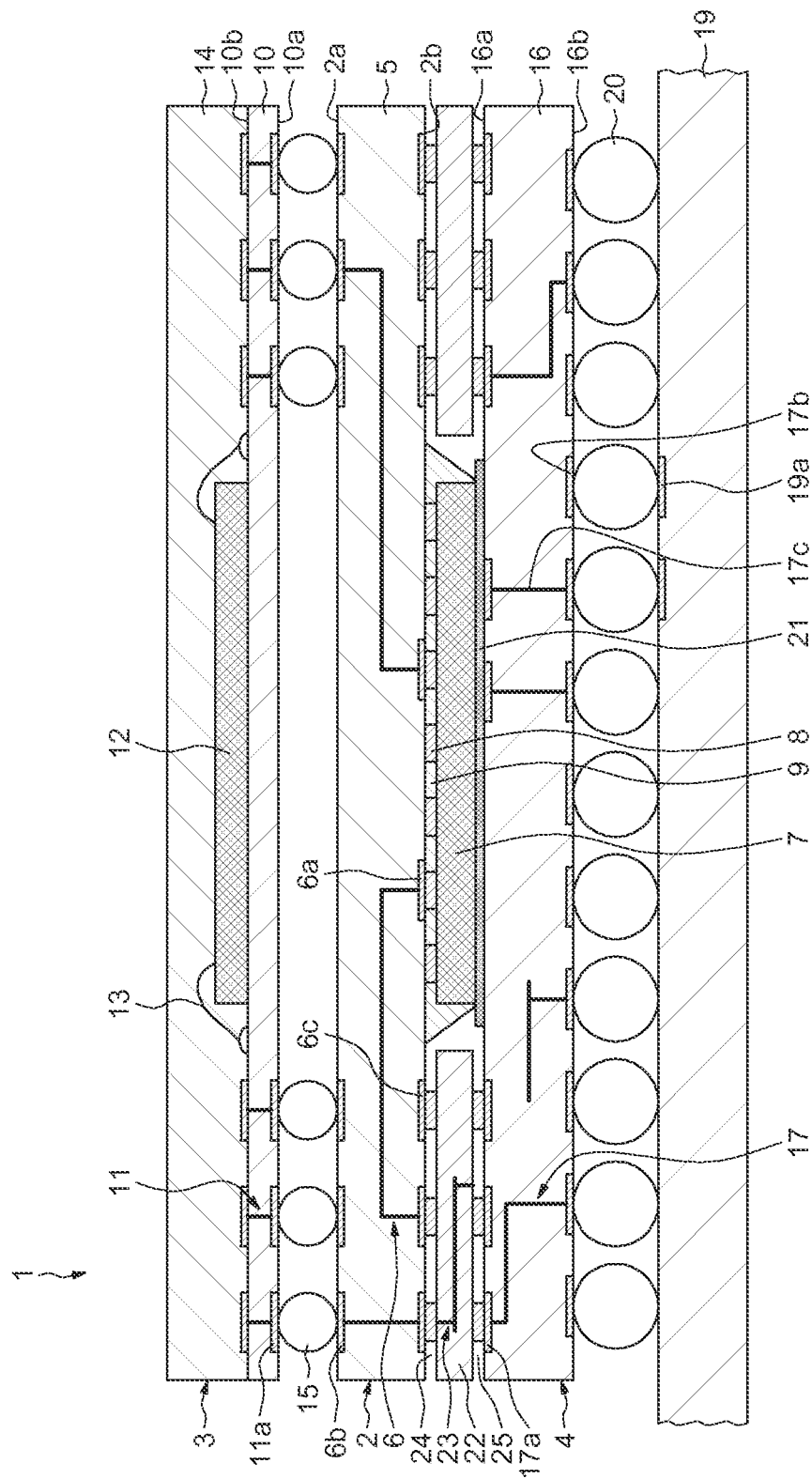
FIG. 2 represents an alternative embodiment of the electronic system of FIG. 1 in cross section.

According to an alternative embodiment which is illustrated in FIG. 2, the intermediate electrical connection elements 18 are omitted and are replaced with an intermediate substrate wafer 22, which is placed between and at a distance from the substrate wafer 5 and the substrate wafer 16, around the chip 7, and which is provided with a metal network 23 for electrical connection of one face to the other, which is electrically connected on the one hand to the electrical connection network 6 by means of electrical connection elements 24 and on the other hand to the electrical connection network 17 by means of electrical connection elements 25.

Owing to the fact that the electrical connection elements 24 and 25 can have cross sections smaller than those of the electrical connection beads 18 of the preceding example, it is possible to increase their density and thus increase the number of electrical connections between the electrical connection network 6 and the electrical connection network 17.

The present invention is not limited to the examples described above. In particular, the chip 12 of the second electronic device 3 could be placed on the same side as the electronic device 2. The chip 12 could be mounted on and connected to the substrate wafer 10 by means of metal electrical connection elements. The electronic device 2 could comprise a layer of an insulating material surrounding the chip 7, in which openings are arranged for placement of the electrical connection elements 18. Numerous other alternative embodiments are possible without departing from the scope of the invention.

What is claimed is:

1. An electronic system, comprising:
   a first integrated-circuit chip having an electrical connection front side and a back side;
   a second integrated-circuit chip;
   a first substrate wafer which extends between the first and second integrated-circuit chips, said electrical connection front side of the first integrated-circuit chip being mounted to a surface of said first substrate wafer;
   a second substrate wafer placed facing the back side of the first integrated-circuit chip;
   a layer of thermally conductive adhesive interposed between the back side of first integrated-circuit chip and a surface of the second substrate wafer; and
   wherein the first integrated-circuit chip and the first substrate wafer form a first electronic device including a first electrical connection network within the first substrate wafer, and wherein the second integrated-circuit chip and a third substrate wafer form a second electronic device including a second electrical connection network within the third substrate wafer.

2. The system of claim 1, further comprising:
first electrical connection elements interposed between the first electronic device and the second electronic device and electrically connecting the first electrical connection network and the second electrical connection network.

3. The system of claim 1, further comprising a third electronic device comprising the second substrate wafer provided with a third electrical connection network.

4. The system of claim 3, further comprising:
second electrical connection elements interposed between the first electronic device and the third electronic device and electrically connecting the first electrical connection network and the third electrical connection network.

5. The system of claim 3, wherein the third electronic device further comprises external electrical connection pads arranged on a face of the third substrate wafer opposite the first integrated-circuit device.

6. The system of claim 3, wherein the thermal adhesive layer mounts the back side of the first integrated-circuit chip in thermal contact to the surface of the second substrate wafer.

7. The system of claim 6, wherein the second substrate wafer comprises metal vias extending through the second substrate wafer from the surface of which is in thermal contact with the first integrated-circuit chip.

8. The system of claim 4, wherein the second electrical connection elements comprise: a further substrate wafer provided with a further electrical connection network electrically connecting the first electrical connection network and the third electrical connection network.

9. An electronic system, comprising:
a first electronic device comprising a first substrate wafer provided with a first electrical connection network and carrying, on a surface thereof, a first integrated-circuit chip that is electrically connected to the first electrical connection network;
a second electronic device comprising a second substrate wafer provided with a second electrical connection network and carrying a second integrated-circuit chip electrically connected to the second electrical connection network;
a third electronic device comprising a third substrate wafer provided with a third electrical connection network;
wherein the first electronic device and the second electronic device are placed above one another in a position such that both the first substrate wafer and the second substrate wafer extend between the first integrated-circuit chip and the second integrated-circuit chip;
wherein the third substrate wafer is placed such that the first integrated circuit chip is between the first substrate wafer and the third substrate wafer;
first electrical connection elements interposed between the first electronic device and the second electronic device and electrically connecting the first electrical connection network and the second electrical connection network;
second electrical connection elements interposed between the first electronic device and the third substrate wafer and electrically connecting the first electrical connection network and the third electrical connection network; and
wherein the third electrical connection network comprises external electrical connection pads arranged on a face of the third substrate wafer opposite the first integrated-circuit device.

10. The system according to claim 9, wherein a layer of a thermally conductive material is interposed between the first integrated-circuit chip and the third substrate wafer.

11. The system according to claim 9, wherein the second electrical connection elements, interposed between the first electronic device and the third substrate, comprise: a further substrate wafer provided with a further electrical connection network electrically connecting the first electrical connection network and the third electrical connection network.

12. The system according to claim 9, wherein the substrate wafer of the third electronic device comprises metal vias located in the region of the chip of the first electronic device.

13. A system, comprising:
a first electronic device comprising a first substrate wafer provided with a first electrical connection network and carrying, on a surface thereof, a first integrated-circuit chip that is electrically connected to the first electrical connection network;
a second electronic device comprising a second substrate wafer provided with a second electrical connection network;
wherein a surface of the second substrate wafer is in thermal contact with said first integrated-circuit chip;
electrical connection elements interposed between the first electronic device and the second substrate wafer and electrically connecting the first electrical connection network and the second electrical connection network;
wherein the second electrical connection network comprises external electrical connection pads arranged on a face of the second substrate wafer opposite the first integrated-circuit device.

14. The system of claim 13, further comprising a thermal adhesive coupling the first integrated-circuit chip to the surface of the second substrate wafer.

15. The system of claim 13, wherein the electrical connection elements, interposed between the first electronic device and the second substrate wafer, comprise: a further substrate wafer provided with a further electrical connection network electrically connecting the first electrical connection network and the second electrical connection network.

16. The system of claim 13, wherein the second substrate wafer comprises metal vias extending through the second substrate wafer from the surface of the second substrate wafer which is in thermal contact with the first integrated-circuit chip.

* * * * *